(12) United States Patent
Yan et al.

(10) Patent No.: US 12,716,863 B2
(45) Date of Patent: Aug. 25, 2026

(54) BIOLOGICAL MATERIAL SENSING SEMICONDUCTOR DEVICE

(71) Applicant: Taiwan Semiconductor Manufacturing Company, Hsinchu (TW)

(72) Inventors: Chuan-Chi Yan, Hsinchu (TW); Yueh-Chuan Lee, Hsinchu (TW); Chia-Chan Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 668 days.

(21) Appl. No.: 18/093,143

(22) Filed: Jan. 4, 2023

(65) Prior Publication Data

US 2024/0151686 A1 May 9, 2024

Related U.S. Application Data

(60) Provisional application No. 63/423,132, filed on Nov. 7, 2022.

(51) Int. Cl.
*G01N 27/414* (2006.01)
*H10D 30/68* (2025.01)

(52) U.S. Cl.
CPC ..... *G01N 27/4145* (2013.01); *H10D 30/6891* (2025.01); *G01N 27/4148* (2013.01)

(58) Field of Classification Search
CPC ........... G01N 27/4145; G01N 27/4148; H10D 30/6891
USPC .......................................................... 257/253
See application file for complete search history.

(56) References Cited

U.S. PATENT DOCUMENTS

2014/0225166 A1* 8/2014 Ellis-Monaghan .......................... H10D 30/021 257/253
2014/0308752 A1* 10/2014 Chang ................ G01N 27/4145 257/253

* cited by examiner

*Primary Examiner* — Eric W Jones
(74) *Attorney, Agent, or Firm* — Lippes Mathias LLP

(57) ABSTRACT

A method of fabricating a semiconductor device for sensing biological material includes: forming a field-effect transistor (FET) on a semiconductor substrate that includes a gate; forming a well within a material disposed over the semiconductor substrate, the well having an opening at a first end and a floor at second end, the well further having one or more side walls extending from the floor toward the opening to define an open-ended cavity into which a fluid may be flowed; forming a via extending through the floor such that an end-most surface of the via resides proud of the floor in a direction of the well's opening, the via being electrically coupled to the gate; and forming a sensing layer that at least partially covers the floor and a portion of the via residing proud of the floor, the sensing layer being reactive to exposure to a biological material.

20 Claims, 5 Drawing Sheets

BIOLOGICAL MATERIAL SENSING SEMICONDUCTOR DEVICE

PRIORITY CLAIM AND CROSS-REFERENCE

This application claims the benefit of U.S. Provisional Patent Application No. 63/423,132, filed Nov. 7, 2022, which is incorporated by reference herein in its entirety.

BACKGROUND

The following relates to the semiconductor arts, and in particular, to a biological material sensing semiconductor device and/or a method for manufacturing the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
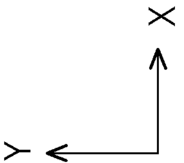
FIG. 1 diagrammatically illustrates a top perspective view of a biological material sensing semiconductor device in accordance with some embodiments disclosed herein.
Figure 1:
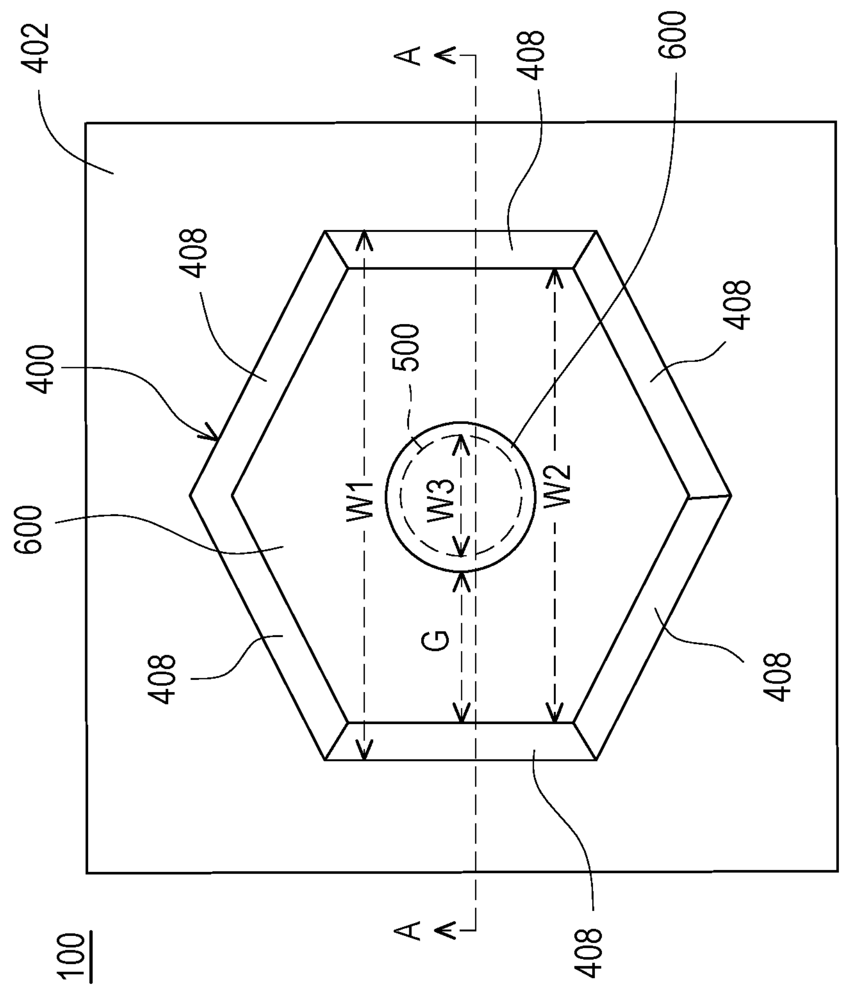

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, in accordance with some embodiments described herein, a biosensor and/or biosensing semiconductor device is disclosed for sensing and/or detecting bio-entities, biomolecules, and/or biological materials. Suitably, the biosensor or biosensing semiconductor device operates on the basis of electronic and/or electrochemical detection principles. In some suitable embodiments, the biosensor and/or biosensing semiconductor device may comprise one or more or more transistors, for example, such a field-effect transistor (FET), a metal-oxide-semiconductor FET (MOSFET), biosensor FET (Bio-FET), ion-sensitive FET (ISFET) or the like. In some suitable embodiments, the detection can be performed by detecting the bio-entities, biomolecules and/or biological materials themselves (also referred to as analytes), or through interaction and/or reaction between specified reactants and bio-entities, biomolecules, biological materials and/or analytes. Advantageously, in some suitable embodiments, the biosensor and/or biosensing semiconductor device may be fabricated using semiconductor manufacturing processes, can quickly convert electric signals, and may be easily applied to integrated circuits (ICs) and microelectromechanical systems (MEMS).

In some suitable embodiments, the biosensing semiconductor device combines a biological material sensing layer or surface with a sensing device or sensor, for example, such as a suitable FET. In some suitable embodiments, the biosensing semiconductor device may comprise a biochip including a plurality of such biosensors. In practice, the biosensor or biosensing semiconductor device includes a microwell or well into which a liquid or fluid containing a target bio-entity, biomolecule or biological material to be sensed is flowed or otherwise introduced. A suitable biologically sensitive layer which is reactive or responsive to a target analyte may be disposed and/or formed in the microwell of well. For example, an electrical property may be modulated and/or alter in response to the biologically sensitive layer being exposed to or coming in contact with the target analyte being sensed. For example, the target analyte may be deoxyribonucleic acid (NDA) or another suitable biomolecule or biological material. If the biochip includes an array of biosensors having biological material sensing layers or surfaces that are sensitive to different bio-entities (e.g., different DNA alleles, different antibody proteins, or so forth), then the biochip can provide a miniaturized laboratory for concurrently performing a set of tests.

In some suitable embodiments, an electrically conductive via electrically couples the biologically sensitive layer to sensor or sensor device, for example, such as to the gate of a FET, optionally, through a multilayer interconnect (MLI) structure. Suitably, the electrically conductive via extends through a bottom surface or floor of the microwell or well into a cavity defined thereby. In practice, an end of the electrically conductive via is proud of and/or above and/or displaced from and/or protruding from the bottom surface or floor of the microwell or well in a direction of the well's opening. In some suitable embodiments, the biologically sensitive layer at least partially overlays and/or covers the portion of the via extending into the cavity (for example, including vertically extending side walls or surfaces of the via) and/or the bottom surface or floor of the micowell or well. Advantageously, in this way, a surface area of the biologically sensitive layer which may be exposed to the target analyte is increase, and accordingly, the performance of the biosensor or biosensing semiconductor device is improved.

Figure 2:
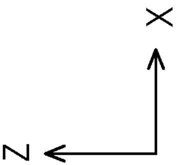
FIG. 2 diagrammatically illustrates a cross-section view of the biological material sensing semiconductor device shown in FIG. 1, taken along section line A-A.
Figure 2:
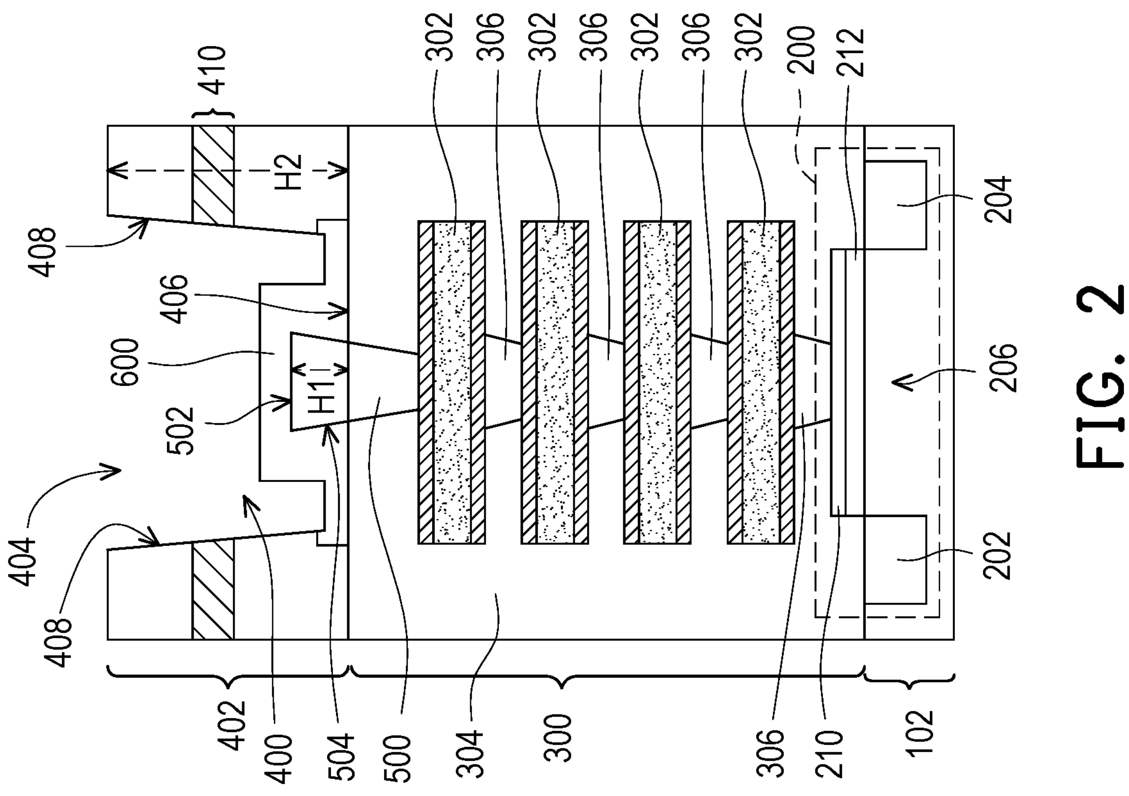

In accordance with some suitable embodiments disclosed herein, FIG. 1 shows a top view of a biologically sensitive semiconductor device 100. FIG. 2 shows a cross sectional view of the biologically sensitive semiconductor device 100 taken along section line A-A. For ease of reference and illustrative purposes herein, in one or more of the selected FIGURES, the various elements and/or components depicted therein are shown relative to an otherwise arbitrarily chosen three-dimensional (3D) cartesian coordinate system including X, Y and Z axes as shown in the FIGURES. While consistency is maintained among and/or across the various FIGURES (unless otherwise explicitly noted), it is to be appreciated the directions and/or orientations indicated by these axes are chosen primarily for the purpose of facilitating the description provided herein, for example, to describe and/or identify relative orientations and/or directions. Unless otherwise indicated, the illustrated coordinate system and/or axes, in and of themselves, are not intended to be limiting and should not be read or interpreted as such.

In accordance with some suitable embodiments, for example as shown in FIG. 2, the biologically sensitive semiconductor device 100 includes a substrate 102 in and/or on which a sensor or sensing device is formed. In some suitable embodiments, as shown in FIG. 2, the sensor or sensing device may comprise a FET 200, for example, without limitation, such as a MOSFET.

In some suitable embodiments, the FET 200 may comprise a source region 202, a drain region 204 and an active region or channel 206, each of which may be formed in the substrate 102. More specifically, as shown in FIG. 2, the active region or channel 206 may be interposed between the source region 202 and the drain region 204. In some suitable embodiments, the substrate 102 may be a semiconductor substrate 102. In practice, the semiconductor substrate 102 may be a silicon (Si) substrate or wafer. In accordance with some embodiments, the substrate 102 may comprise, for example, without limitation, another elementary semiconductor such as germanium (Ge); a compound semiconductor including silicon carbide (SiC), gallium arsenide (GaAs), gallium phosphide (GaP), indium phosphide (InP), indium arsenide (InAs), and/or indium antimonide (InSb); an alloy semiconductor including silicon germanium (SiGe), gallium arsenide phosphide (GaAsP), aluminum indium arsenide (AlInAs), aluminum gallium arsenide (AlGaAs), gallium indium arsenide (GalnAs), gallium indium phosphide (GaInP), and/or gallium indium arsenide phosphide (GaInAsP); or combinations thereof. In various embodiments, the substrate 102 is a semiconductor-on-insulator (SOI) substrate. The SOI substrate may include a buried oxide (BOX) layer formed, for example, without limitation, by a process such as separation by implanted oxygen (SIMOX), and/or other suitable processes. The substrate 102 may be doped with a dopant such as a p-type dopant and/or an n-type dopant, for example.

In accordance with some suitable embodiments, as shown in FIG. 2, the FET 200 may further comprise a gate structure including a gate electrode layer or gate 210 and electrically insulating layer or gate dielectric 212 and/or one or more other suitable layers. In practice, the gate electrode layer or gate 210 is formed proximate and/or next to the active region or channel 206 of the FET 200 and is separated and/or spaced apart from the active region or channel 206 of the FET 200 by the electrically insulating layer or gate dielectric 212. In some suitable embodiments, the gate electrode layer or gate 210 is polysilicon. In other suitable embodiments, the gate electrode layer or gate 210 may comprise, for example, without limitation, a metal gate electrode including materials such as, copper (Cu), tungsten (W), titanium (Ti), tantalum (Ta), chromium (Cr), platinum (Pt), silver (Ag), gold (Au), suitable metallic compounds like titanium nitride (TiN), tantalum nitride (TaN), nickel silicon (NiSi), cobalt silicon (CoSi), and/or combinations of these electrically conductive materials. In some suitable embodiments, the electrically insulating layer or gate dielectric 212 may comprise silicon oxide, for example, silicon dioxide ($SiO_2$). In other suitable embodiments, materials for the electrically insulating layer or gate dielectric 212 include, for example, without limitation, silicon nitride (for example, $Si_3N_4$), silicon oxynitride ($SiO_xN_y$), a dielectric material with a high dielectric constant (that is a high-k material), and/or combinations thereof. Some non-limiting examples of suitable high-k materials for the electrically insulating layer or gate dielectric 212 include hafnium silicate ($HfSiO_4$), hafnium oxide ($HfO_2$), zirconium oxide ($ZrO_2$), aluminum oxide ($Al_2O_3$), tantalum pentoxide ($Ta_2O_5$), hafnium dioxide-alumina ($HfO_2$—$Al_2O_3$) alloy, and/or combinations thereof.

In accordance with some suitable embodiments, the FET 200 may be an n-type FET (nFET) or a p-type FET (pFET). For example, in practice, the source and/or drain regions 202 and 204 may comprise one or more n-type dopants or p-type dopants depending on the type of FET 200. In practice, the FET 200 may be formed using, for example, without limitation, one or more semiconductor fabrication and/or manufacturing processes such as, photolithography and/or suitable layer pattering; ion implantation; diffusion; material deposition and/or layer forming processes including physical vapor deposition (PVD), metal evaporation or sputtering, chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), spin on coating; material removal processes such as etching including wet etching, dry etching, and plasma etching; chemical mechanical polishing (CMP); and/or other suitable semiconductor fabrication and/or manufacturing processes.

In accordance with some suitable embodiments, for example as shown in FIG. 2, a multi-layer interconnect (MLI) structure 300 may be formed over the FET 200. In practice, the MLI structure 300 may include one or more electrically conductive lines and/or layers 302 (for example, patterned metallization layers) separated and/or spaced apart from one another by one or more interposing electrically insulating layers comprising an interlayer dielectric (ILD) 304, and one or more electrically conductive MLI vias or plugs 306 extending through the ILD and selectively connecting one or more of the electrically conductive lines and/or layers 302 to one another. In some suitable embodiments, the MLI vias or plugs 306 extend through the ILD 304 between one or more of the electrically conductive lines and/or layers 302 to form a floating gate. For example, in some suitable embodiments, the MLI structure 300 may provide physical and/or electrical connection to the sensor or sensor device. For example, the MLI structure 300 may provide an electrical connection to the gate electrode layer or gate 210 of the FET 200. In some suitable embodiments, the conductive lines and/or layers 302 may comprise copper, aluminum, tungsten, tantalum, titanium, nickel, cobalt, metal silicide, metal nitride, poly silicon, combinations thereof, and/or other materials possibly including one or more layers and/or linings. The interposing or inter-layer dielectric layers (for example, the ILD) may comprise silicon dioxide, fluorinated silicon glass (FGS), SILK (a product of Dow Chemical of Michigan), BLACK DIAMOND (available from Applied Materials of Santa Clara, Calif.), and/or other electrically insulating materials. In practice, the MLI structure 300 may be formed by suitable semiconductor manufacturing and/or fabrication processes, for example, including, without limitation, CVD, PVD, ALD, plating, spin-on coating, and/or other suitable processes.

Referring to the example shown in FIG. 2, the MLI structure 300 is disposed on the substrate 102 over the FET 200. Suitably, the MLI structure 300 includes a plurality of electrically conductive lines and/or patterned layers 302 selectively connected to one another by the electrically conductive MLI vias or plugs 306. In some suitable embodiments, the electrically conductive lines or patterned layers 302 comprise aluminum and/or copper. In some suitable embodiments, the electrically conductive MLI vias or plugs 306 comprise tungsten. In other suitable embodiments, the electrically conductive MLI vias or plugs 306 comprise copper. In practice, the one or more dielectric layers 304 forming the ILD may be disposed on the substrate 102 interposing the electrically conductive features of the MLI structure 300. The one or more dielectric layers 304 may comprise an inter-layer dielectric or ILD (sometimes referred to as an inter-metal dielectric (IMD) or IMD layer) and it may be composed of multiple ILD sub-layers. In some suitable embodiments, the one or more dielectric layers 304 may comprise silicon oxide or silicon dioxide ($SiO_2$). In some suitable embodiments, in addition to providing a suitable electrical connection to the gate electrode layer or gate 210 of the FET 200, the MLI structure 300 may also provide suitable electrical connections the source and drain regions 202 and 204 of the FET 200.

In some suitable embodiments, as shown in FIG. 2 for example, a microwell or well 400 is disposed on and/or formed over the MLI structure 300. For example, the microwell or well 400 may be formed in a layer of material 402. The layer of material 402 may be an extension of ILD material of the MLI structure 300 or may be an additional layer or dielectric or oxide material disposed over the MLI structure 300. In some suitable embodiments, the first ILD material 304 and the second ILD material 402 may comprise a same dielectric and/or oxide material or different dielectric and/or oxide materials. In some suitable embodiments, the layer of material 402 may comprise sub-layers that may optionally include a passivation layer 410 therein. The materials of the microwell or well 400 may in general be chosen for compatibility with a fluid to be tested, and for compatibility with the bio-entity (e.g. DNA or protein) contained in the fluid (or suspected to be contained in the fluid, to be determined by the testing).

Suitably, as shown in FIG. 2 for example, the microwell or well 400 may have an opening 404 at a first or upper end thereof and a bottom surface or floor 406 at second end thereof, the second end being opposite the first end. In some suitable embodiments, the bottom surface or floor 406 of the microwell or well 400 is more proximate or nearer to the sensor or sensor device, for example, the FET 200, as compared to the opening 404 at the first or upper end of the microwell or well 400. In some suitable embodiments, the microwell or well 400 further has one or more side walls or surfaces 408 extending from the bottom surface or floor 406 of the microwell or well 400 toward and/or to the opening 404 at the first or upper end of the microwell or well 400 to define an open-ended cavity into which a liquid or fluid may be selectively flowed and/or otherwise introduced through the opening 404 of the microwell or well 400 at the first or upper end thereof. In some embodiments, a cross section of the microwell or well 400 and/or open-ended cavity defined thereby, for example, when taken substantially parallel to the bottom surface or floor 406 of the microwell or well 400 (i.e., substantially parallel to the X-Y plane and/or substantially normal to the Z axis), has a polygonal shape including three or more sides. For example, as seen in FIG. 1, the microwell or well 400 may have, for example, six side walls or surfaces 408 such that the cavity defined by the microwell or well 400 has the shape of frustum with a hexagonal base. More generally, in some suitable embodiments, the number of side walls or surfaces 408 may be more or less than six in practice. In some suitable embodiments, the microwell or well 400 has three or more side walls or surfaces 408 and the shape of the cavity defined thereby is a polygonal frustrum, for example, without limitation, a right polygonal frustrum. In some other suitable embodiments, the microwell or well 400 has one conical side wall or surface 408 and the shape of the cavity defined thereby is a conical frustrum, for example, without limitation, a right conical frustrum. In yet other suitable embodiments, the microwell or well 400 has one cylindrical side wall or surface 408 and the shape of the cavity defined thereby is a cylinder, for example, without limitation, a right cylinder.

In some suitable embodiments, for example as seen in FIG. 2, the side walls or surfaces 408 of the microwell or well 400 are inclined, for example, with respect to the Z axis. Accordingly, a width or diameter of the cavity (for example, measured normal or substantially normal to the Z axis) defined by the microwell or well 400 at the opening 404 or first or upper end of the microwell or well 400 has a dimension W1, while a width or diameter of the cavity (for example, measured normal or substantially normal to the Z axis) defined by the microwell or well 400 at second end thereof including the bottom surface or floor 406 has a dimension W2, where W2 is less than W1. In some suitable embodiments, a first area encompassed between the one or more side walls or surfaces 408 of the microwell or well 400 at the opening 404 of the microwell or well 400 is greater than a second area encompassed between the one or more side walls or surfaces 408 of the microwell or well 400 at the bottom surface or floor 406 of the microwell or well 400. Advantageously, the wider opening 404 permits liquids or fluids containing solid phase supports, for example, such as microparticles, nanoparticles, beads, or the like, carrying and/or supporting biological material or other like analytes being sensed, to be readily flowed and/or otherwise introduced into the microwell or well 400.

In accordance with some suitable embodiments, for example as shown in FIG. 2, an electrically conductive via 500 is formed extending through the bottom surface or floor 406 of the microwell or well 400, such that an end-most surface 502 of the via resides proud of (i.e. above) the bottom surface or floor 406 of the microwell or well 400 in a direction of the well's opening 404. Put another way, the end of the via protrudes from the bottom surface or floor 406 of the microwell or well 400 and thus protrudes a distance H1 (indicated in FIG. 2) into the volume or cavity of the microwell or well 400. It is to be appreciated that in FIG. 1, where the biologically sensitive semiconductor device 100 is depicted from a top view perspective, the electrically conductive via 500 resides below and/or under a biological material sensing layer 600 disposed over and/or at least partially covering the electrically conductive via 500, and accordingly, in FIG. 1 the electrically conductive via 500 is indicated by a dashed or ghost line.

In practice, the electrically conductive via 500 may extend through the bottom surface or floor 406 of the microwell or well 400 into the cavity defined by microwell or well 400 such that the end-most surface 502 of the electrically conductive via 500 is proud of and/or above and/or raised and/or displaced within and/or protruding into the cavity from the bottom surface or floor 406 of the microwell or well 400 in a direction of the opening 404 by the distance H1, for example, where H1 is measure in a direction of the Z axis and/or normal or substantially normal to the bottom surface or floor 406 of the microwell or well 400. In accordance with some suitable embodiments disclosed herein, the distance H1 may be in a range of between 100 angstroms (Å) to 1100 Å (10-110 nm), inclusive. In practice, the distance H1 is less than a distance H2 which corresponds to a height of the microwell or well 400, where H2 is measure between the first end of the microwell or well 400 having the opening 404 and the second end of the microwell or well 400 including the bottom surface or floor 406, for example, where H2 is measure in a direction of the Z axis and/or normal or substantially normal to the bottom surface or floor 406 of the microwell or well 400. Advantageously, the distance H1 being in the aforementioned range and/or less then the height of the microwell or well 400 provides a suitable increase in a surface area of a sensing layer formed within the microwell or well 400 (for example, with the sensing layer being disposed over and/or covering at least a portion of the electrically conductive via 500 and/or the bottom surface or floor 406 of the microwell or well 400), while still leaving sufficient room (for example, a sufficient volume) within the cavity defined by the microwell or well 400 to readily receive a suitable amount and/or volume of liquid or fluid therein which may contain solid phase supports, for example, such as microparticles, nanoparticles, beads, or the like, carrying and/or supporting biological material or other like analytes being sensed.

As described, the embodiment of FIG. 2 includes the multi-layer interconnect (MLI) structure 300 with multiple (e.g., illustrative four) electrically conductive lines and/or layers 302. In some embodiments, the MLI structure 300 constitutes a single electrically conductive line and/or layer (in which case it is no longer a multi-layer interconnect, but rather a single-layer interconnect). In yet other contemplated embodiments, the single- or mult-layer interconnect structure is omitted entirely, and the electrically conductive via 500 extends from a direct connection to the gate electrode layer or gate 210 of the FET 200 upward (for the orientation shown in FIG. 2, i.e. along the Z-direction) so that its opposite end penetrates through and protrudes from the floor 406 of the microwell or well 400.

In accordance with some suitable embodiments, in addition to the end-most surface 502, the electrically conductive via 500 further has one or more side walls or surfaces 504 residing within the cavity defined by the microwell or well 400. In practice, the one or more side walls or surfaces 504 of the electrically conductive via 500 that reside within the cavity extend down from the end-most surface 502 of the electrically conductive via 500 toward and/or to the bottom surface or floor 406 of the microwell or well 400. In some suitable embodiments, the electrically conductive via 500 may have one conical or substantially conical side wall or surface 504 or one cylindrical or substantially cylindrical side wall or surface 504. In accordance with some suitable embodiments, the electrically conductive via 500 may have a diameter or width W3, for example measured at the end-most surface 502 of the electrically conductive via 500 in a direction normal or substantially normal to Z axis (i.e., within the X-Y plane and/or parallel or substantially parallel to the bottom surface or floor 406 of the microwell or well 400). In some suitable embodiments, W3 is sufficiently less than W2 such that when biological material sensing layer 600 overlays the side walls or surfaces 504 of the electrically conductive via 500 a gap G remains with respect to the side walls or surfaces 408 of the microwell or well 400. The illustrative end-most surface 502 of the electrically conductive via 500 is shown as planar (e.g. in the X-Y plane). An option to advantageously increase the total surface area of the protruding portion of the via 500 is to make the end-most surface 502 curved, e.g. having a peaked or convex or concave shape (variants not shown).

In some other suitable embodiments, the electrically conductive via 500 may have three or more side walls or surface 504 and a cross section of the electrically conductive via 500, for example, when taken substantially parallel to the bottom surface or floor 406 of the microwell or well 400 (i.e., substantially parallel to the X-Y plane and/or substantially normal to the Z axis), has a polygonal shape including three or more sides. More generally, in some suitable embodiments, the electrically conductive via 500 may have three or more side walls or surfaces 504 and the shape of the electrically conductive via 500 may be a polygonal frustrum, for example, without limitation, a right polygonal frustrum. In some other suitable embodiments, the electrically conductive via 500 has one conical side wall or surface 504 and the shape of the electrically conductive via 500 maybe a conical frustrum, for example, without limitation, a right conical frustrum. In yet other suitable embodiments, the electrically conductive via 500 has one cylindrical side wall or surface 504 and the shape of the electrically conductive via is a cylinder, for example, without limitation, a right cylinder. Suitably, the various polygonal shapes and/or cross-sections disclosed herein advantageously allows for varying degrees of freedom in the design and/or manufacturing of the respective elements to accommodate at variety of use cases and/or applications, while still advantageously increasing a surface area of the sensing layer exposed within a cavity of the well.

In some suitable embodiments, for example as seen in FIG. 2, the one or more side walls or surfaces 504 of the electrically conductive via 500 are inclined, for example, with respect to the Z axis. Accordingly, a width or diameter of the electrically conductive via 500 (for example, measured normal or substantially normal to the Z axis) has a dimension W3 (as shown in FIG. 1) at the end-most surface 502, while having a smaller dimensions therebelow, for example, at or near the bottom surface or floor 406 of the microwell or well 400. This optional inclination of the side walls or surfaces 504 advantageously increases the surface area of the side wall or surface 504 as compared with a straight or vertical side wall.

In some suitable embodiments, the electrically conductive via 500 may comprise tungsten. In other suitable embodiments, the electrically conductive via 500 may comprise copper or another suitable electrically conductive material or metal.

In accordance with some suitable embodiments, a biological material sensing layer 600 is formed and/or disposed within the cavity defined by the microwell or well 400. In practice, the biological material sensing layer 600 may overlay and/or at least partially cover that portion of the electrically conductive via 500 extending into cavity defined by the microwell or well 400, for example, including the end-most surface 502 of the electrically conductive via 500 and/or the side walls or surfaces 504 of the electrically conductive via 500, as well as at least a portion of the bottom surface or floor 406 of the microwell or well 400. In some suitable embodiments, the biological material sensing layer 600 may further extend up and/or at least partially cover some portion of the side walls or surfaces 408 of the microwell or well 400. In some suitable embodiments, the biological material sensing layer 600 is reactive and/or responsive to exposure to and/or contact with bio-entities, biomolecules, and/or biological materials being sensed, or a subsequently added coating applied to the biological material sensing layer provides such reactivity or responsiveness. In some suitable embodiments, an electrical property (for example, without limitation, such as a surface charge or a distribution of surface charge) of the layer 600 or of a coating that is applied thereto is modulated or altered in response to exposure to and/or contact with bio-entities, biomolecules, and/or biological materials being sensed. In some suitable embodiments, the biological material sensing layer 600 may comprise TiN or another suitable material, such as a metal oxide. If desired, a coating (not shown) may be applied to the biological material sensing layer 600 which serves as a base for a biochemical template (e.g. DNA template or protein template) that includes bonded organic molecules (e.g., DNA or protein molecules) of a configuration designed to bond with high specificity to an assay target. For example, if the biologically sensitive semiconductor device 100 is intended to assay a particular allele of a DNA strand, then the coating may include DNA or other organic molecules whose configuration bonds with high specificity to DNA strands with that particular allele.

In practice, the electrically conductive via 500 electrically couples the biological sensing layer 600 disposed with the microwell or well 400 to the sensor or sensing device, for example, to the gate electrode layer or gate 210 of the FET 200. In some suitable embodiments, the biological sensing layer 600 is electrically coupled to the gate electrode layer or gate 210 of the FET 200 by the electrically conductive via 500 through the MLI structure 300. Accordingly, the electrically conductive via 500 may contact an upper or top-most electrically conductive line or patterned layer 302 of the MLI structure 300, while a bottom or lower-most MLI via 306 contacts the gate electrode layer or gate 210 of the FET 200.

Figure 3:
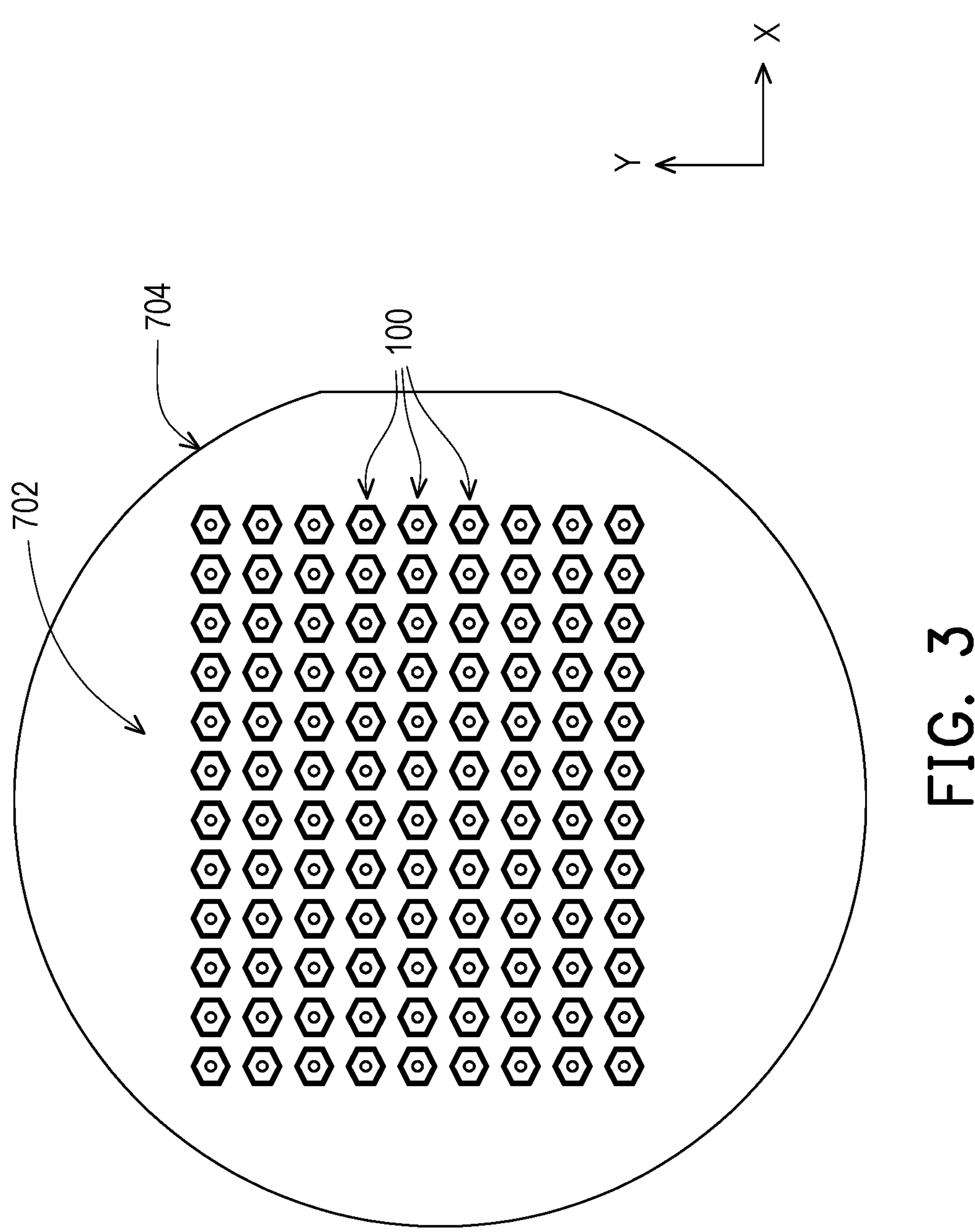
FIG. 3 illustrates a biochip including a two-dimensional array of biological material sensing semiconductor devices.

With continuing reference to FIGS. 1 and 2 and further reference now to FIG. 3, while for simplicity and/or clarity herein FIGS. 1 and 2 only illustrate a single biologically sensitive semiconductor device 100, in some suitable embodiments, a biochip 700 may be provided an or fabricated or manufacture, for example, including a array 702 of the biologically sensitive semiconductor devices 100 shown in FIGS. 1 and 2 fabricated on a wafer or substrate 704, such as a silicon wafer. The wafer or substrate 704 suitably corresponds to the substrate 102 of FIG. 2. The two-dimensional array 702 of the illustrative biochip 700 extends over a surface of the wafer or substrate 704 in the X-Y plane. The illustrative array 702 includes a 12×9 array 702 of biologically sensitive semiconductor devices 100, however, the array may more generally be rectilinear with N×M cells where N and M are positive integers; or, the two-dimensional array of devices may be non-rectilinear, e.g. a hexagonal array of the biologically sensitive semiconductor devices 100 may be employed. In some embodiments, the biological material sensing layer 600 may be coated with different biochemical template coatings for the different biologically sensitive semiconductor devices 100 of the array 702. For example, the different biological template coatings may be sensitive to different proteins, different deoxyribonucleic acid (DNA) configurations, different antibodies, and/or so forth. In such a way, the biochip 700 can constitute a miniaturized biological laboratory or "lab-on-a-chip" that can simultaneously perform a large number of tests on a given fluidic sample. As one nonlimiting illustrative example, if the biologically sensitive semiconductor devices 100 of the array 702 form a set of devices 100 that are sensitive to different alleles that are characteristic of a particular genetic disease or condition, then that disease or condition can be assayed rapidly and with high accuracy as the entire set of correlated alleles can be tested simultaneously. As another nonlimiting illustrative example, if the biologically sensitive semiconductor devices 100 of the array 702 form a set of devices 100 that are sensitive to different antibody proteins then the biochip 700 constitutes an antibody microarray. Suitably, the biochip 700 may further comprise an IC including the FETs 200 along with a variety of semiconductor logic devices and/or the like to process signals received from the FETs 200 of the array 702 of biologically sensitive semiconductor devices 100. In some embodiments, the FETs 200 of the different biologically sensitive semiconductor devices 100 of the array 702 may have individually tuned FET characteristics to facilitate performing different types of biological assays (e.g. protein versus DNA detection, for example). As a nonlimiting illustrative example, the IC can include logic circuitry for analyzing the outputs of the FETs 200 of the biologically sensitive semiconductor devices 100 of the array 702 to automatically diagnose one or more diseases or medical conditions.

Figure 4:
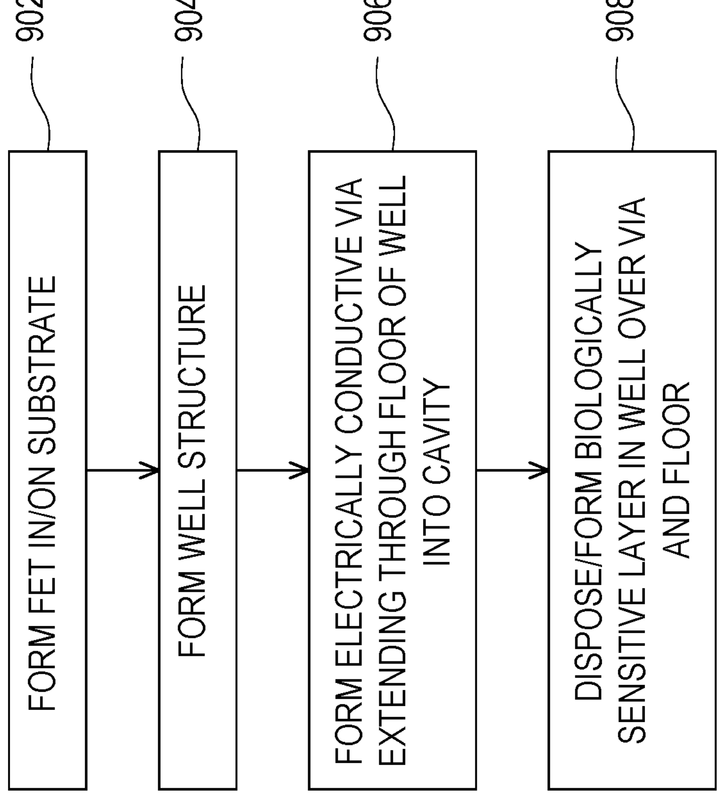
FIG. 4 is a flow chart showing a method of fabricating a biological material sensing semiconductor device in accordance with some embodiments disclosed herein.

FIG. 4 shows a process 900 for forming a biologically sensitive semiconductor device 100 in accordance with some embodiments disclosed herein.

In the illustrated embodiment, the process includes at step 902 forming a FET (for example, such as the FET 200) on a semiconductor substrate (for example, such as the substrate 102). In practice, the formed FET may including source and drain regions with a channel region interposed therebetween and a gate structure including a gate separated from the channel region by a gate dielectric.

At step 904, in accordance with some suitable embodiments, a well (for example, such as well 400) is formed within a material disposed over the semiconductor substrate. In practice, the well may have an opening (for example, such as opening 404) at a first end thereof and a floor (for example, such as floor 406) at second end thereof, where the second end of the well is opposite the first end of the well. In some suitable embodiments, the well may further have one or more side walls (for example, such as side walls 408) extending from the floor of the well toward the opening of the well to define an open-ended cavity into which a liquid or fluid may be selectively flowed. In some suitable embodiments, the liquid or fluid may contain a biological material which is to be sensed.

At step 906, in accordance with some suitable embodiments, an electrically conductive via (for example, such as the electrically conductive via 500) is formed to extend through the floor of the well such that an end-most surface of the via resides proud of the floor of the well in a direction of the well's opening. In some suitable embodiments, the via is electrically coupled to the gate of the FET.

At step 908, in accordance with some suitable embodiments, a biological material sensing layer (for example, such as the biological material sensing layer 600) is formed to at least partially cover the floor of the well and a portion of the via residing proud of the floor of the well. In practice, the biological material sensing layer is suitably reactive to exposure to a biological material.

It is to be understood that the process 900 of FIG. 4 is a nonlimiting illustrative example, and that numerous variants are contemplated. For example, in one variant the steps 904 and 906 are integrated together. In this variant, the well structure 402 is formed as a continuous layer including formation of the electrically conductive via 500, and then the opening 404 is formed by etching using photolithographic patterning to define the opening 404 and using an etchant (or combination of etchants) that remove the material of the well structure 402 (e.g., etchants that are effective for etching intermetal dielectric (IMD) material) but which do not etch the copper or other metal of the electrically conductive via 500.

Figure 5:
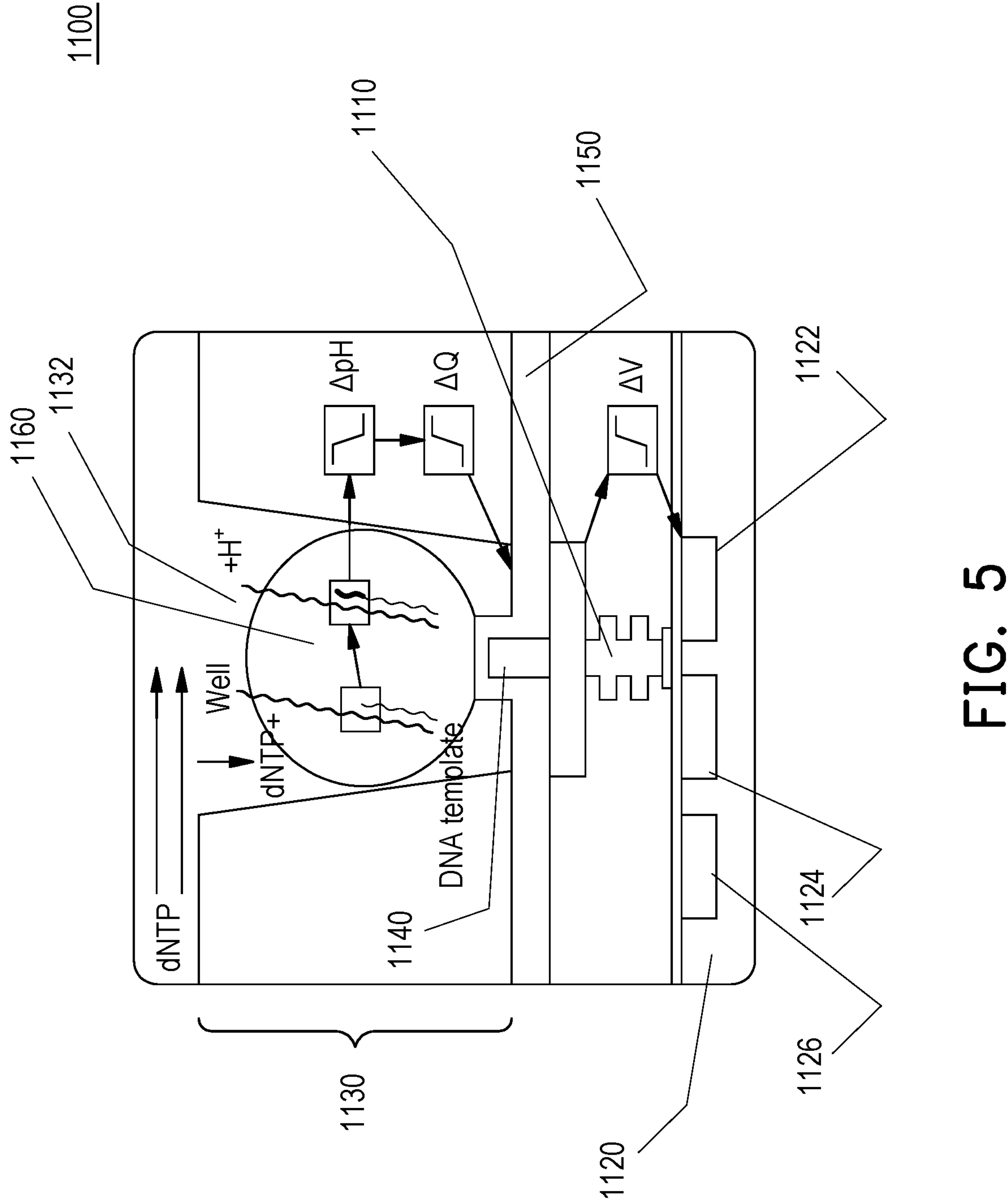
FIG. 5 is another diagrammatical illustration depicting a cross-section view of a biological material sensing semiconductor device in accordance with some embodiments disclosed herein.

In some suitable embodiments, the microwell can be significant to DNA product accuracy. In some embodiments, the microwell can be utilized as a sensing plate to detect DNA chemical liquid signa to do DNA sequencing. FIG. 5 shows another view depicting a cross-section of a biological material sensing semiconductor device 1100 in accordance with some embodiments disclosed herein. In some suitable embodiments, the biological material sensing semiconductor device 1100 may be manufactured, formed, constructed and/or operate similarly to the device 100 shown in FIG. 2. As shown in FIG. 5, a floating metal gate 1110 or the like may be formed or otherwise disposed over a silicon or other suitable substrate 1120 in which a source region 1122, a drain region 1124 and a bulk region 1126 of a FET (e.g., such an ion-sensitive FET (ISFET)) may be suitably arranged. In the illustrated embodiment, a microwell 1130 is disposed over the floating gate 1110 and an electrically conductive via 1140 extends from the floating gate 1110 into a cavity 1132 of the microwell 1130, suitably covered by a metal-oxide or other like sensing layer 1150. In practice, the extension of the via 1140 into the cavity 1132 of the microwell 1130 acts to increase the exposed surface area of the sensing layer 1150 within the well, while still allowing the well cavity 1132 to receive and/or accept a template carrying bead 1160 or the like.

As shown, the well cavity 1132 is suitably sized and/or dimensioned to readily receive and/or accept the bead 1160 or the like when a bead bearing liquid or the like is suitably flowed over the microwell 1130. In practice, the bead 1160 may act a carrier for and/or otherwise contain a suitable DNA template or other biological material template. Suitably, in the illustrated embodiment, the well 1130 is shown receiving and/or accepting the bead 1160 containing the DNA template, along with the underlying sensor and/or electronics. In practice, protons (H+) may be released when nucleotides (e.g., represented here as deoxynucleotide triphosphate (dNTP)) are incorporated on the growing DNA strands, changing the pH of the well (denoted here by ΔpH). In turn, this induces a change in surface potential (denoted here by ΔQ) of the metal-oxide-sensing layer 1150, and a corresponding change in potential (denoted here by ΔV) of the source terminal of the underlying FET or ISFET. In some suitable embodiments, an integrated circuit (IC) may consist of a suitably sizable array of sensor elements, each with a single floating gate connected to an underlying ISFET. In some suitable embodiments, high-speed addressing and/or readout may be accomplished by suitable semiconductor electronics integrated with the sensor array. In some suitable embodiments, the sensor and underlying electronics can provide a direct transduction from the incorporation event to an electronic signal, and each sensor may be used to independently and directly monitor the hydrogen ions released during nucleotide incorporation.

In some suitable embodiments, the vias 500 and/or 1140 may be suitably formed using any one or more of a number CMOS and/or other suitable semiconductor manufacturing techniques and/or processes, e.g., including but not limited to suitable photolithography, masking, patterning, material deposition, metallization, etching and/or material removal steps.

In the following, some further illustrative embodiments are described.

In some embodiments, a method of fabricating a semiconductor device for sensing biological material includes: forming a field-effect transistor (FET) on a semiconductor substrate, the FET including source and drain regions with a channel region interposed therebetween and a gate structure including a gate separated from the channel region by a gate dielectric; forming a well within a material disposed over the semiconductor substrate, the well having an opening at a first end thereof and a floor at second end thereof, the second end being opposite the first end, the well further having one or more side walls extending from the floor of the well toward the opening of the well to define an open-ended cavity into which a fluid may be selectively flowed; forming a via extending through the floor of the well such that an end-most surface of the via resides proud of the floor of the well in a direction of the well's opening, the via being electrically coupled to the gate of the FET; and forming a sensing layer that at least partially covers the floor of the well and a portion of the via residing proud of the floor of the well, the sensing layer being reactive to exposure to a biological material.

In some further embodiments, an electrical property of the sensing layer is modulated in response to exposure to the biological material.

In still additional embodiments, the sensing layer comprises one of titanium nitride (TiN) and a metal-oxide material.

In some embodiments, the biological material sensed is deoxyribonucleic acid (DNA).

In yet further embodiments, the method further includes creating a multi-layer interconnect (MLI) between the via and gate, the MLI electrically coupling the via to the gate, the MLI including a stack of one or more electrically conductive layers within an interlayer dielectric (ILD), the electrically conductive layers being electrically connected to one another through one or more MLI vias extending through the ILD between the electrically conductive layers to form a floating gate.

In some further embodiments, the end-most surface of the via is proud of the floor of the well by a distance H1 measured normal to the floor of the well, where H1 is in a range of between 100 angstroms (Å) to 1100 Å, inclusive.

In some embodiments, a distance H2 between the floor and opening of the well is greater than the distance H1, where H2 is measured normal to the floor of the well.

In yet further embodiments, a cross-section of the well taken parallel to the floor of the well has a polygonal shape including three or more sides.

In some embodiments, wherein a cross-section of the via taken parallel to the floor of the well has a polygonal shape including three or more sides.

In some further embodiments, a first area encompassed between the one or more side walls of the well at the opening of the well is greater than a second area encompassed between the one or more side walls of the well at the floor of the well.

In still further embodiments, the sensing layer has a first area covering the end-most surface of the via, the first area being less than a second area encompassed between the one or more side walls of the well at the floor of the well.

In yet additional embodiments, a biologically sensitive semiconductor device includes: a sensor; a well having an opening at a first end thereof and a floor at second end thereof, the second end being more proximate to the sensor than the first end, the well further having one or more side walls extending between the floor of the well and the opening of the well such that an open-ended cavity is defined by the well into which a biological material may be selectively introduced through the opening of the well; an electrically conductive via extending through the floor of the well into the cavity such that an end of the via within the cavity is protrudes from the floor of the well by a distance H1; and a biologically sensitive layer within the well that at least partially covers the floor of the well and that portion of the via residing within the cavity defined by the well, the biologically sensitive layer being reactive to the biological material. Suitably, the via electrically couples the biologically sensitive layer to the sensor.

In some further embodiments, the sensor comprises a field-effect transistor (FET) including a gate to which the via is electrically coupled.

In some additional embodiments, the FET comprises a metal-oxide-semiconductor FET (MOSFET).

In some embodiments, the device further includes a multi-layer interconnect (MLI), the MLI electrically coupling the via to the sensor, the MLI including a stack of one or more metal layers within an interlayer dielectric (ILD), the metal layers being electrically connected to one another through one or more MLI vias extending through the ILD between the metal layers.

In some embodiments, the distance H1 is measured normal to the floor of the well and is in a range of between 100 angstroms (Å) to 1100 Å, inclusive.

In some further embodiments, a first area encompassed between the one or more side walls of the well at the opening of the well is greater than or equal a second area encompassed between the one or more side walls of the well at the floor of the well.

In still further embodiments, a biosensor field-effect transistor (Bio-FET) device includes: a well having an open first end, a closed second end defining a first well surface, and one or more well side surfaces extending from the first well surface toward the open first end of the well, such that an open-ended cavity is defined by the well into which a liquid may be selectively flowed through the open first end; a biologically sensitive layer disposed within the well, the biologically sensitive layer having an electrical property which is altered in response to biological material being selectively introduced into the well; and an electrically conductive via contacting the biologically sensitive layer. Suitably, an exposed surface area of the biologically sensitive layer disposed within the well is greater than an area defined by the one or more well side surfaces at the first well surface.

In yet further embodiments, the via has a portion thereof disposed within the cavity, the portion including an end-most surface of the via which is displaced from the first well surface in a direction of the open first end of the well and one or more via side surfaces extending between the end-most surface of the via and the first well surface.

In still one more embodiment, the biologically sensitive layer at least partially covers the first well surface, the end-most surface of the via and the one or more via side surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device for sensing biological material, said method comprising:

forming a field-effect transistor (FET) on a semiconductor substrate, the FET including source and drain regions with a channel region interposed therebetween and a gate structure including a gate separated from the channel region by a gate dielectric;

forming a via in an interlayer dielectric above the FET that is electrically coupled to the gate of the FET;

etching a well within the interlayer dielectric material, the well having an opening at a first end thereof and a floor at a second end thereof, the second end being opposite the first end, the well further having one or more side walls extending from the floor of the well toward the opening of the well to define an open-ended cavity into which a fluid may be selectively flowed, and the one or more side walls including a notch along the floor of the well;

wherein the etching results in forming the via extending through the floor of the well, the via having one or more side walls and an end-most surface, wherein the one or more side walls extend above the floor of the well and the end-most surface of the via resides proud of the floor of the well in a direction of the well's opening; and forming a sensing layer that directly contacts the floor of the well, the one or more side walls of the via, and at least a portion of the end-most surface of the via residing proud of the floor of the well, and that fills the notch, and that does not extend up the one or more side walls to the opening of the well, the sensing layer being reactive to exposure to a biological material.

2. The method of claim 1, wherein an electrical property of the sensing layer is modulated in response to exposure to the biological material.

3. The method of claim 1, wherein the sensing layer comprises one of titanium nitride (TiN) and a metal-oxide material.

4. The method of claim 1, wherein the biological material sensed is deoxyribonucleic acid (DNA).

5. The method of claim 1, further comprising:

creating a multi-layer interconnect (MLI) between the via and gate, the MLI electrically coupling the via to the gate, the MLI including a stack of one or more electrically conductive layers within the interlayer dielectric (ILD), the electrically conductive layers being electrically connected to one another through one or more MLI vias extending through the ILD between the electrically conductive layers to form a floating gate.

6. The method of claim 1, wherein the end-most surface of the via is proud of the floor of the well by a distance H1 measured normal to the floor of the well, where H1 is in a range of between 100 angstroms (Å) to 1100 Å, inclusive.

7. The method of claim 6, wherein a distance H2 between the floor and opening of the well is greater than the distance H1, where H2 is measured normal to the floor of the well.

8. The method of claim 1, wherein a cross-section of the well taken parallel to the floor of the well has a polygonal shape including three or more sides.

9. The method of claim 1, wherein a cross-section of the via taken parallel to the floor of the well has a polygonal shape including three or more sides.

10. The method of claim 1, wherein a first area encompassed between the one or more side walls of the well at the opening of the well is greater than a second area encompassed between the one or more side walls of the well at the floor of the well.

11. The method of claim 1, wherein the sensing layer has a first area covering the end-most surface of the via, the first area being less than a second area encompassed between the one or more side walls of the well at the floor of the well.

12. A method of making a semiconductor device, comprising:

forming a transistor on a substrate, the transistor including a gate;

forming a multi-layer interconnect (MLI) over the transistor, the MLI including a stack of one or more electrically conductive layers within an interlayer dielectric (ILD), the electrically conductive layers being electrically connected to one another through one or more MLI vias extending through the ILD between the electrically conductive layers;

forming a via in the ILD above the MLI, the via being electrically coupled through the MLI to the gate of the transistor, the via having one or more side walls and an end-most surface;

etching a well within the ILD, the well having an opening and a floor to define an open-ended cavity into which a fluid may be selectively flowed, and also having a notch in a sidewall of the well, the notch being located along the floor;

wherein the etching results in the one or more side walls and the end-most surface of the via extending above the floor of the well; and forming a sensing layer that directly contacts the floor of the well, the one or more side walls of the via, and at least a portion of the end-most surface of the via extending above the floor of the well, and that fills the notch, and that does not extend up the sidewall of the well, the sensing layer being reactive to exposure to a biological material.

13. The method of claim 12, wherein the sensing layer comprises one of titanium nitride (TiN) and a metal-oxide material.

14. The method of claim 12, wherein the end-most surface of the via is proud of the floor of the well by a distance H1 measured normal to the floor of the well, where H1 is in a range of between 100 angstroms (Å) to 1100 Å, inclusive.

15. The method of claim 14, wherein a distance H2 between the floor and opening of the well is greater than the distance H1, where H2 is measured normal to the floor of the well.

16. The method of claim 12, wherein a cross-section of the well taken parallel to the floor of the well has a polygonal shape including three or more sides.

17. The method of claim 12, wherein a cross-section of the via taken parallel to the floor of the well has a polygonal shape including three or more sides.

18. The method of claim 12, wherein a first area encompassed between the one or more side walls of the well at the opening of the well is greater than a second area encompassed between the one or more side walls of the well at the floor of the well.

19. A method of making a semiconductor device, comprising:

forming a transistor on a substrate, the transistor including a gate;

forming a material layer over the transistor;

forming a via that is electrically coupled to the gate of the transistor within the material layer;

etching a well within the material layer, the well having an opening and a floor to define an open-ended cavity into which a fluid may be selectively flowed, and also having a notch in a sidewall of the well, the notch being located along the floor, and wherein one or more sidewalls of the via and an end-most surface of the via extend above the floor of the well; and forming a sensing layer over the via, the sensing layer being reactive to exposure to a biological material, wherein the sensing layer directly contacts the floor of the well and the one or more side walls of the via and covers at least a portion of the end-most surface of the via extending above the floor of the well, and also fills the notch and does not extend up the sidewall of the well.

20. The method of claim 19, wherein the sensing layer has a first area covering the end-most surface of the via, the first area being less than a second area encompassed between the one or more side walls of the well at the floor of the well.

* * * * *